United States Patent [19]
Wensel

[11] Patent Number: 5,969,427
[45] Date of Patent: Oct. 19, 1999

[54] USE OF AN OXIDE SURFACE TO FACILITATE GATE BREAK ON A CARRIER SUBSTRATE FOR A SEMICONDUCTOR DEVICE

[75] Inventor: Richard W. Wensel, Boise, Id.

[73] Assignee: Micron Technology, Inc., Boise, Id.

[21] Appl. No.: 09/019,275

[22] Filed: Feb. 5, 1998

[51] Int. Cl.⁶ .................................................. H01L 23/495
[52] U.S. Cl. ............................................ 257/787; 438/476
[58] Field of Search ...................... 257/690, 723, 257/725, 758, 760, 762, 787, 791, 793, 794, 647, 700, 701, 702, 703; 29/840; 438/476, 480, 496

[56] References Cited

U.S. PATENT DOCUMENTS

| | | | |
|---|---|---|---|
| 4,460,537 | 7/1984 | Heinle | 264/272 |
| 4,615,857 | 10/1986 | Baird | 264/272 |
| 4,784,974 | 11/1988 | Butt | 257/710 |
| 4,910,581 | 3/1990 | Baird | 357/72 |
| 5,417,826 | 5/1995 | Blalock | 204/176 |
| 5,434,750 | 7/1995 | Rostoker et al. | 361/784 |
| 5,542,171 | 8/1996 | Juskey et al. | 29/840 |
| 5,557,150 | 9/1996 | Variot et al. | 257/787 |
| 5,635,671 | 6/1997 | Freyman et al. | 174/52.2 |
| 5,656,549 | 8/1997 | Woosley et al. | 438/118 |
| 5,708,567 | 1/1998 | Shim et al. | 257/675 |

*Primary Examiner*—Tom Thomas
*Assistant Examiner*—Luan Thai
*Attorney, Agent, or Firm*—Trask, Britt & Rossa

[57] ABSTRACT

An encapsulant molding technique used in chip-on-board encapsulation wherein an oxidizable metal layer is patterned on a substrate and the oxidizable metal layer is oxidized to facilitate removal of unwanted encapsulant material. The oxidizable metal layer which adheres to the substrate is applied over a specific portion of the substrate. The oxidizable metal layer is oxidized to form a metal oxide layer which does not adhere to encapsulant materials.

6 Claims, 6 Drawing Sheets

USE OF AN OXIDE SURFACE TO FACILITATE GATE BREAK ON A CARRIER SUBSTRATE FOR A SEMICONDUCTOR DEVICE

BACKGROUND OF THE INVENTION

1. Field of the Invention:

The present invention relates to chip-on-boar encapsulation. More particularly, the present invention relates to an encapsulant molding technique used in chip-on-board encapsulation wherein an oxidizable metal layer is patterned on a carrier substrate and a top surface of the oxidizable metal layer is oxidized to facilitate removal of unwanted encapsulant material deposited during the molding operation.

2. State of the Art:

In the fabrication of semiconductor devices, a common circuit integration technique involves attaching individual semiconductor components, such as semiconductor chips, to a surface of a carrier substrate, such as a printed circuit board (e.g. FR-4), ceramic substrate, BT substrate, cyanate ester substrate, or silicon substrate, by any known chip-on-board attachment technique. Such chip-on-board attachment techniques include, but are not limited to, flip-chip attachment, TAB attachment, and wire bond attachment. After attachment, the semiconductor components may be encapsulated with a viscous liquid or gel insulative material (e.g., silicones, polyimides, epoxies, plastics, and the like) ("encapsulant material") with a transfer molding technique. This encapsulation (depending on its formulation) allows each semiconductor component to better withstand exposure to a wide variety of environmental conditions, such as moisture, ion impingements, heat, and abrasion.

An exemplary transfer molding technique for forming an encapsulant over a semiconductor component is illustrated in FIGS. 11–16. It should be understood that the figures presented in conjunction with this description are not meant to be actual views of any particular portion of an actual semiconductor component or molding device, but are merely idealized representations which are employed to more clearly and fully depict the process of the invention than would otherwise be possible.

FIG. 11 illustrates a pair of semiconductor components 202 attached to a carrier substrate 204 and in electrical communication with the carrier substrate 204 through a plurality of wire bonds 206. As shown in FIGS. 12 and 13, a multi-cavity encapsulant mold 208 is placed over the carrier substrate 204 and semiconductor components 202 (shown in shadow line in the top plan view illustrated in FIG. 12), such that cavities 210 (shown in shadow line in the top plan view illustrated in FIG. 12) of the multi-cavity encapsulant mold 208 are substantially centered over each semiconductor component 202. The multi-cavity encapsulant mold 208 is pressed against the carrier substrate 204 to prevent the border or other portions of the carrier substrate 204 from being covered by encapsulant material to be subsequently injected.

The cavities 210 of the multi-cavity transfer mold 208 are usually connected by an interconnection array of channels 212 connected to a central reservoir 214 (see FIG. 12) from which an encapsulant material, such as a molten particle-filled polymer, is fed under pressure. Usually, the channels 212 have constricted regions called "gates" 216 adjacent each cavity 210, as shown in FIG. 13. The gate 216 controls the flow and injection velocity of the encapsulant material 218 into each cavity 210 and forms a break point abutting the cavity 210 to permit removal of the excess channel encapsulant 222 which solidifies in the channels 212, as shown in FIG. 14. After the encapsulation of the semiconductor component 202 is complete and the encapsulant solidified, the multi-cavity transfer mold 208 is removed, as shown in FIG. 15. The excess channel encapsulant 222 at locations defined by channels 212 is then leveraged (shown in shadow lines in FIG. 15) from the surface of the carrier substrate 204 and broken free at an indentation 224 formed by the gate 216 (see FIGS. 13 and 14), called "gate break", as shown in FIG. 16.

The adhesion of the solidified encapsulant 218 to the carrier substrate 204 must be very strong such that the solidified encapsulant 218 does not detach from carrier substrate 204. However, this strong adhesion is disadvantageous when attempting to remove the excess channel encapsulant 222 from the carrier substrate 204. If the adhesion between the excess channel encapsulant 222 and the carrier substrate 204 exceeds the cohesive strength of the material of the carrier substrate 204 itself, the carrier substrate 204 will delaminate or rupture when the excess channel encapsulant 222 is leveraged from the surface of the carrier substrate 204.

Various methods have been devised to prevent the excess channel encapsulant from adhering to the carrier substrate. One such method is presented in U.S. Pat. No. 5,542,171 issued Aug. 6, 1996 to Juskey et al. ("the Juskey patent") which relates to treating a predetermined portion of the surface of the carrier substrate over which the mold channels will reside to prevent the excess encapsulant material thereon from adhering to the carrier substrate. The Juskey patent teaches selectively contaminating the surface portion with an ink or a polymer. A drawback of the Juskey patent is that applying inks or polymers to the carrier substrate surface risks contamination of the area adjacent a semiconductor chip, which contamination may prevent the adhesion of the encapsulant material over the semiconductor chip to the carrier substrate, resulting in a compromised package.

Furthermore, the technique taught in the Juskey patent would not be applicable to FR-4 substrates (flame retardant epoxy glass laminate). FR-4 requires a cleaning step, such as plasma cleaning, just before encapsulation to remove unwanted organic compounds in order to obtain sufficiently strong adhesion between the encapsulant material and the FR-4 substrate. Unfortunately, the plasma cleaning would also remove the ink or polymer as taught in the Juskey patent and, as mentioned above, addition of inks or polymers after such cleaning would risk contamination of the area adjacent a semiconductor chip. Thus, for an FR-4 substrate, the predetermined surface portion on the carrier substrate is plated with gold. The gold plating adheres to the FR-4 substrate, but not to most encapsulant materials. Also, this non-adhering property of the gold to encapsulant materials is not affected during the plasma cleaning of the carrier substrate. However, such gold plating is expensive.

An alternative arrangement of channels which injects the encapsulant material from the top (i.e., no excess encapsulant material on the carrier substrate when encapsulating the semiconductor component) has been used, but this requires a more complex and expensive molding system.

Thus, it can be appreciated that it would be advantageous to develop an inexpensive technique to treat a predetermined portion of the surface of the carrier substrate, over which the transfer mold channels will reside to prevent the excess encapsulant material from sticking to the carrier substrate while using commercially-available, widely-practiced semiconductor device transfer-molding packaging techniques.

SUMMARY OF THE INVENTION

The present invention relates to an encapsulant molding technique used in chip-on-board encapsulation wherein an oxidizable metal layer is patterned on a carrier substrate and a top surface of the oxidizable metal layer is oxidized to facilitate removal of unwanted encapsulant material.

The oxidizable metal layer is applied, by any known means, over a specific portion of the carrier substrate to reside at a bottom of an interconnect channel of an encapsulant mold used in a subsequent transfer molding step. Oxidizable metals, such as copper, silver, or the like, adhere to carrier substrates, such as FR-4, ceramic, or silicon substrates. The oxidizable metal layer is then oxidized to form a metal oxide layer in and/or on an upper surface of the oxidizable metal layer. Such a metal oxide layer does not adhere to most encapsulant materials.

A semiconductor chip is then attached to the carrier chip and an encapsulant mold is placed over the carrier substrate and semiconductor chip, such that a cavity of the encapsulant mold is substantially centered over the semiconductor chip. An encapsulant material is injected into the encapsulant mold cavity through at least one interconnection channel which is connected to an encapsulant material source. Preferably, the interconnection channel has a gate adjacent the encapsulant mold cavity to control the flow and injection velocity of the encapsulant material into the encapsulant mold cavity.

The encapsulant material solidifies and the encapsulant mold is removed, wherein the gate forms an indentation abutting the cavity. Excess encapsulant solidified in the interconnection channel is leveraged or otherwise pulled from the surface of the carrier substrate and broken free at the indentation. Optionally, the metal layer/metal oxide layer may then be removed.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

FIGS. 1–10 illustrate a method of applying an oxidizable metal layer on a predetermined portion of a surface of a carrier substrate, wherein the oxidizable metal layer is oxidized to facilitate the removal of unwanted encapsulant material from the carrier substrate, and the molding of an encapsulant material over a semiconductor device according to one embodiment of the present invention. It should be understood that the figures presented in conjunction with this description are not meant to be actual views of any particular portion of an actual semiconductor component or molding system, but are merely idealized representations which are employed to more clearly and fully depict the process of the invention than would otherwise be possible.

Figure 1:
FIG. 1 is a side cross-sectional view of a chip-on-board assembly.
Figure 2:
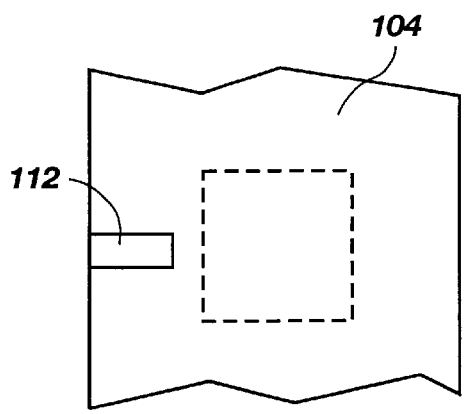
FIG. 2 is a top plan view of the chip-on-board assembly having an oxidizable metal layer patterned on the carrier substrate.

FIGS. 1-2 illustrate a side cross-sectional view and a top plan view, respectively, of an oxidizable metal layer 112 applied over a specific portion of a carrier substrate 104, such as a printed circuit board (e.g., FR-4), ceramic or silicon substrate, to reside as the bottom of an interconnection channel of an encapsulant mold used in a subsequent transfer molding step (dashed lines of FIG. 2 represents a placement position of a semiconductor chip to be subsequently attached). Oxidizable metals, such as copper, silver, or the like, adhere to carrier substrates, such as FR-4, ceramic, or silicon substrates. The oxidizable metal layer 112 may be applied by any known means, such as stenciling, masking/deposition, or the like. However, it is preferred to use a copper metal deposited through a mask to a depth from between about 70 and 300 microinches.

Figure 3:
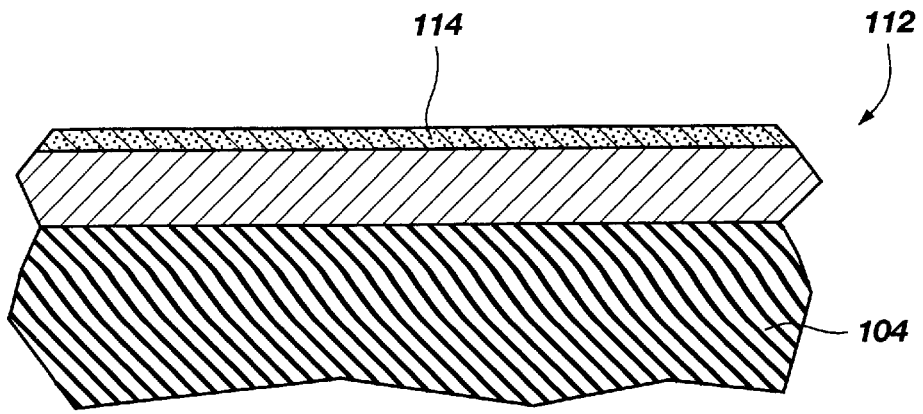
FIG. 3 is a cross-sectional view of FIG. 2.

The oxidizable metal layer 112 is then oxidized to form a metal oxide layer 114 in and/or on an upper surface of the metal layer by any known method, as shown in FIG. 3, which forms an encapsulant release layer. For example, a copper layer would oxidize in an ambient atmosphere when held at a temperature of about 175° C. for about 10 minutes. A layer of copper oxide of a thickness of approximately 400 angstroms or greater (preferably about 1500 angstroms) can cause delamination between the copper oxide and encapsulant materials, such as filled-polymer materials including, but not limited to, epoxy molding compounds. Furthermore, a layer of silver oxide of a thickness of approximately 25 angstroms or greater will cause similar delimination between the silver oxide and encapsulant materials.

Figure 4:
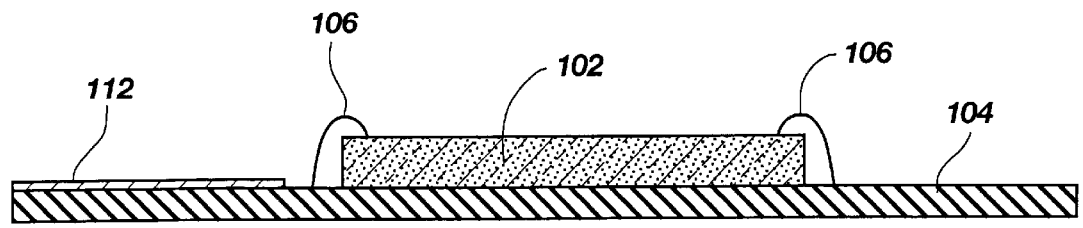
FIG. 4 is a side cross-sectional view of the oxidizable metal layer having an oxide layer formed thereon.

FIG. 4 illustrates the attachment of a semiconductor chip 102 to the carrier substrate 104, wherein electrical contact, such as between pads on said semiconductor chip 102 to traces on the surface of the carrier substrate 104, is made with wire bonds 106. It is, of course, understood that the semiconductor chip 102 could be in electrical communication with the carrier substrate 104 by other techniques, such as TAB or flip-chip attachment.

Figure 5:
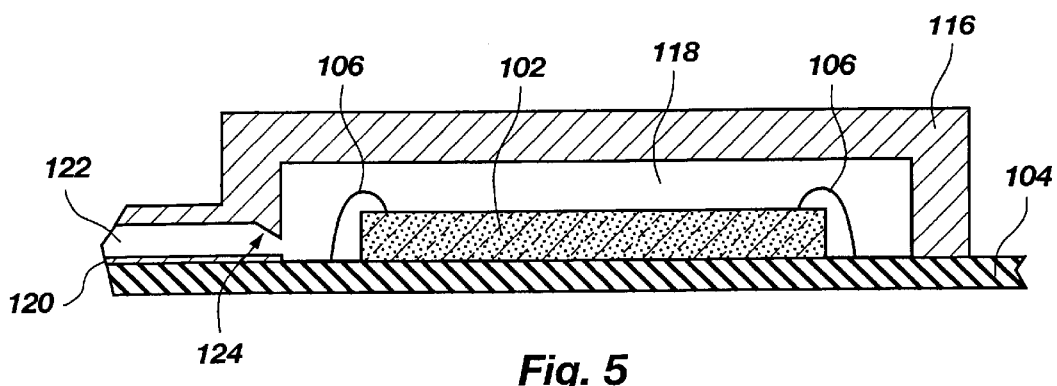
FIG. 5 is a side cross-sectional view of an encapsulant mold covering a semiconductor chip on the chip-on-board assembly.

As shown in FIG. 5, an encapsulant transfer mold 116 is placed over the carrier substrate 104 and semiconductor chip 102, such that a cavity 118 of the encapsulant mold 116 is substantially centered over the semiconductor chip 102. The encapsulant mold 116 is pressed against the carrier substrate 104 to prevent the border of the carrier substrate 104 from being covered by encapsulant material to be subsequently injected.

The encapsulant mold cavity 118 is connected to an encapsulant material source (not shown) by an interconnection channel 122. The oxidizable metal layer 112/metal oxide layer 114 (collectively, "oxidized metal layer 120") is formed in a position to reside as the bottom of the interconnection channel 122, as shown in FIG. 5. Preferably, the interconnection channel 122 has a constriction or gate 124 adjacent the encapsulant mold cavity 118, as shown in FIG. 5, to control the flow and injection velocity of encapsulant material into the encapsulant mold cavity 118.

Figure 6:
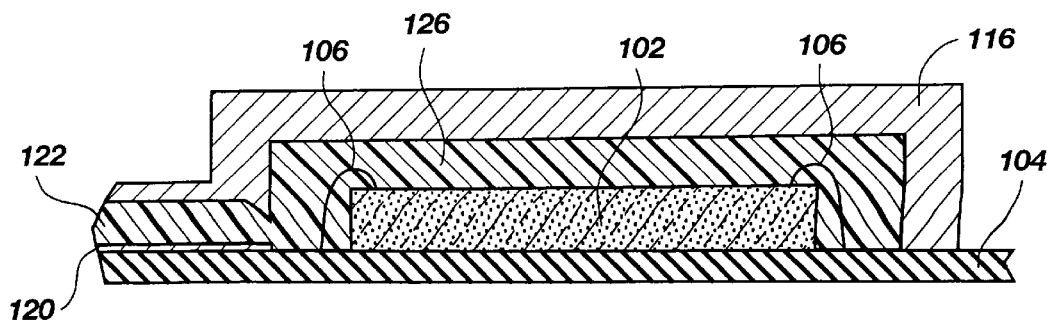
FIG. 6 is a side cross-sectional view of the encapsulant mold filled with encapsulant material.
Figure 7:
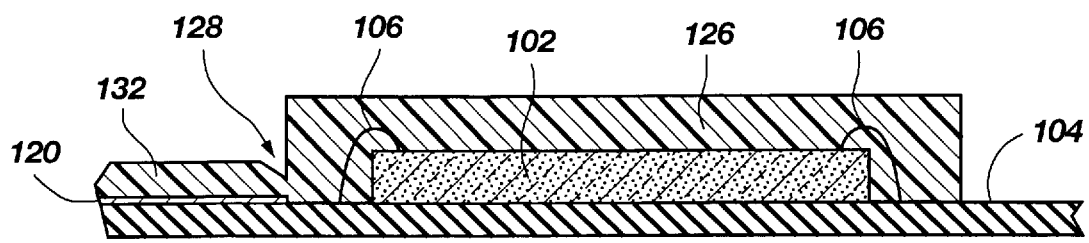
FIG. 7 is a side cross-sectional view of an encapsulated semiconductor chip prior to the removal of excess channel encapsulant.
Figure 8:
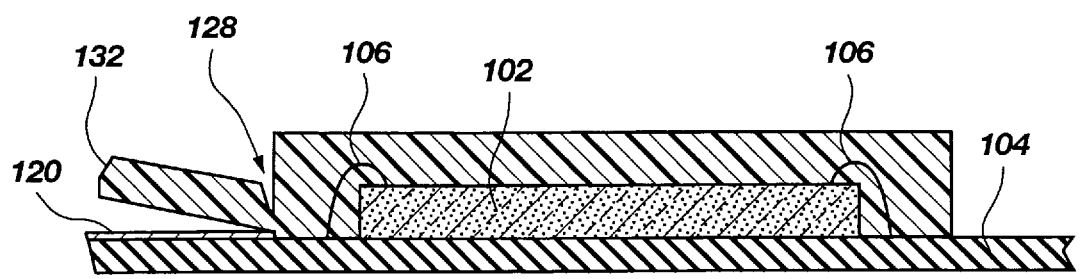
FIG. 8 is a side cross-sectional view of an encapsulated semiconductor chip with the excess channel encapsulant leveraged from the carrier substrate.
Figure 9:
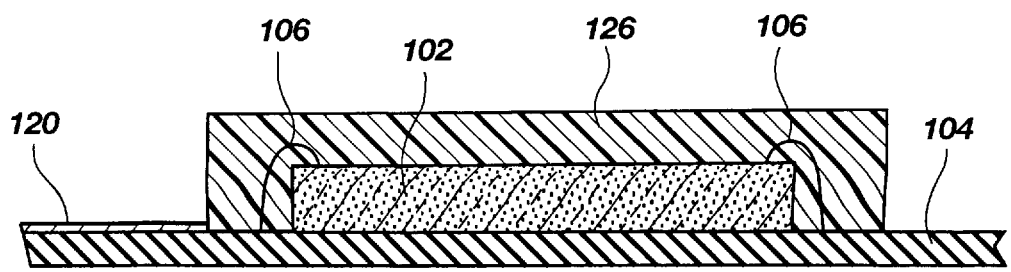
FIG. 9 is a side cross-sectional view of an encapsulated semiconductor chip after the removal of excess channel encapsulant.
Figure 10:
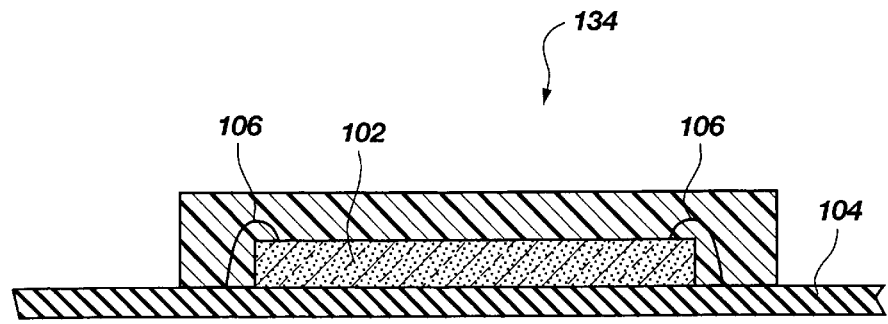
FIG. 10 is a side cross-sectional view of an encapsulated semiconductor chip after removal of the oxidizable metal layer.
Figure 11:
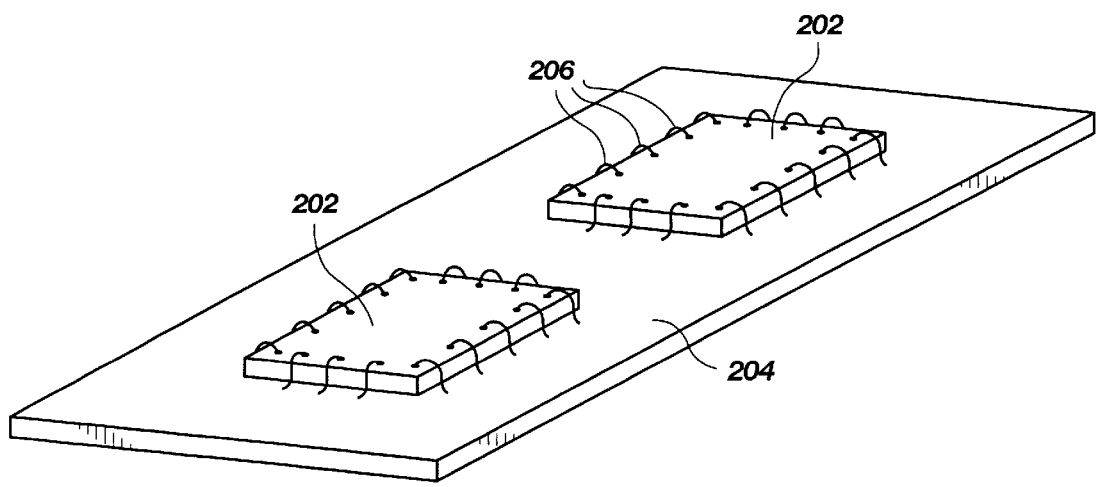
FIG. 11 is an oblique view of a pair of semiconductor components electrically connected to a carrier substrate by wire bonds.
Figure 12:
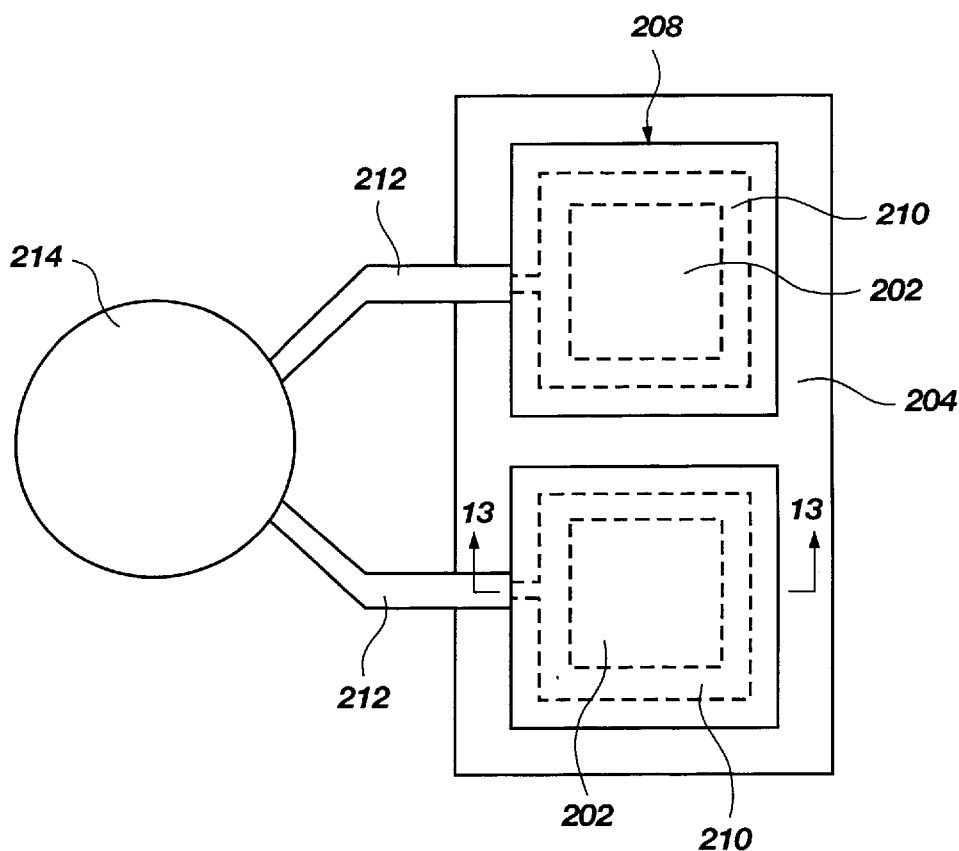
FIG. 12 is a top plan view of an encapsulant mold covering semiconductor components according to a known technique.
Figure 13:
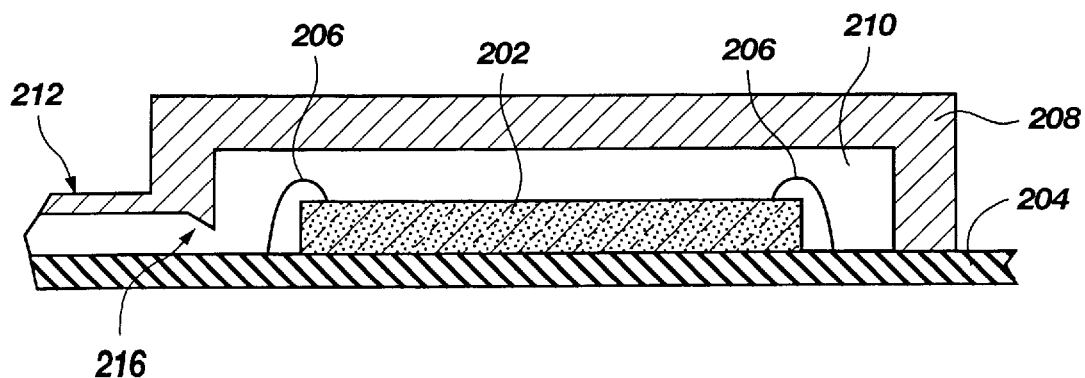
FIG. 13 is a side cross-sectional view of an encapsulant mold covering a semiconductor component according to a known technique.
Figure 14:
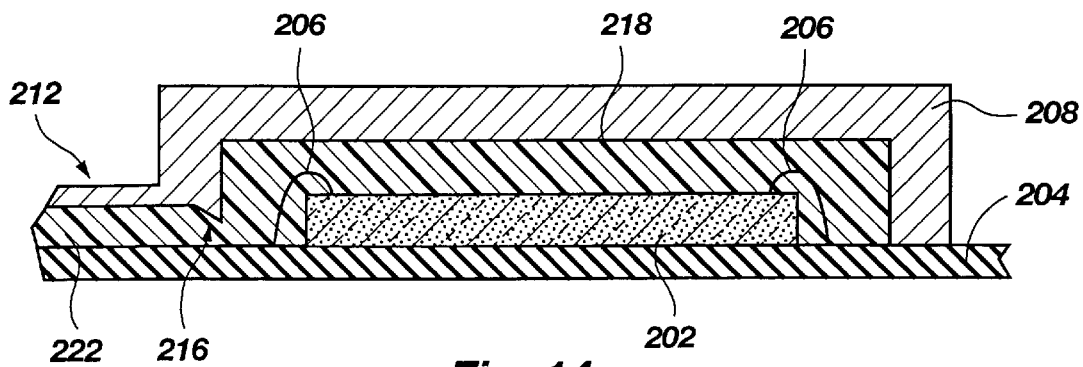
FIG. 14 is a side cross-sectional view of an encapsulant filled mold according to a known technique.
Figure 15:
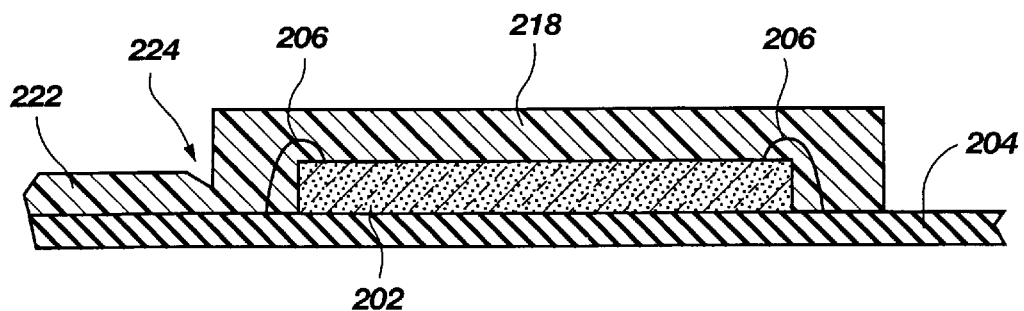
FIG. 15 is a side cross-sectional view of an encapsulated semiconductor component prior to the removal of excess channel encapsulant according to a known technique.
Figure 16:
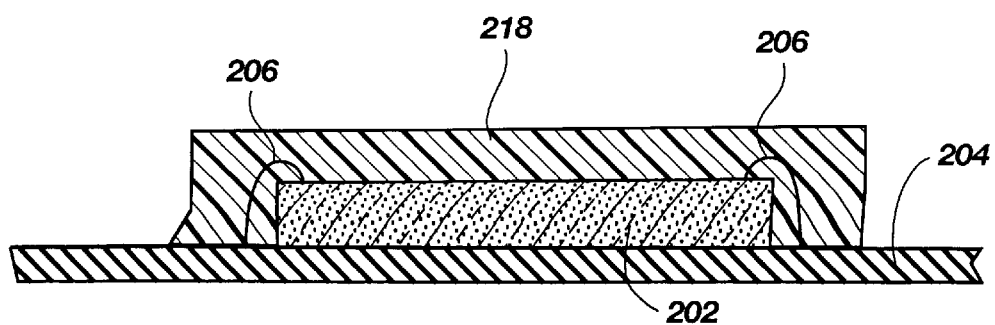
FIG. 16 is a side cross-sectional view of an encapsulated semiconductor component after removal of excess channel encapsulant according to a known technique.

As shown in FIG. 6, a molten encapsulant material 126 is injected under pressure into the encapsulant mold cavity 118 (see FIG. 5) through the interconnection channel 122 to fill the encapsulant mold cavity 118. The encapsulant material 126 in the cavity 118 and the interconnection channel 122 cools and solidifies and the encapsulant mold 116 is removed, as shown in FIG. 7. The gate 124 (see FIG. 5) forms an indentation 128 abutting the encapsulant mold cavity 118. Excess encapsulant 132 solidified in the interconnection channel 122 is leveraged from the surface of the carrier substrate 104, as shown in FIG. 8, and broken free at the indentation 128, as shown in FIG. 9. Optionally, the remaining oxidized metal layer 120 may be removed to form the encapsulated structure 134, as shown in FIG. 10.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A carrier assembly comprising:
    a carrier substrate;
    a semiconductor device attached to and in electrical communication with said carrier substrate; and
    an oxide-surfaced path formed on and abutting said carrier substrate, said oxide-surfaced path extending from a location proximate said semiconductor device to a periphery of said carrier substrate.

2. The carrier assembly of claim 1, wherein said oxide-surfaced path comprises an oxidizable metal layer.

3. The carrier assembly of claim 2, wherein said oxidizable metal layer is selected from the group consisting of copper and silver.

4. A chip-on-board assembly comprising:
    a carrier substrate;
    at least one semiconductor device attached to and in electrical communication with said carrier substrate, wherein an encapsulant material encases said at least one semiconductor device; and
    an oxide-surfaced path formed on and abutting said carrier substrate, said oxide-surfaced path extending from a location proximate a periphery of said encapsulant material encasing said at least one semiconductor device to a periphery of said carrier substrate.

5. The chip-on-board assembly of claim 4, wherein said oxide-surfaced path comprises an oxidizable metal layer.

6. The chip-on-board assembly of claim 5, wherein said oxidizable metal layer is selected from the group consisting of copper and silver.

* * * * *